(12) United States Patent
Hinrichsen et al.

(10) Patent No.: US 11,114,987 B2
(45) Date of Patent: Sep. 7, 2021

(54) SWITCHABLE POWER AMPLIFICATION STRUCTURE

(71) Applicant: Qorvo US, Inc., Greensboro, NC (US)

(72) Inventors: Carsten Hinrichsen, Aalborg (DK); Søren Deleuran Laursen, Vestbjerg (DK)

(73) Assignee: Qorvo US, Inc., Greensboro, NC (US)

( * ) Notice: Subject to any disclaimer, the term of this patent is extended or adjusted under 35 U.S.C. 154(b) by 91 days.

(21) Appl. No.: 16/552,333

(22) Filed: Aug. 27, 2019

(65) Prior Publication Data

US 2020/0295718 A1 Sep. 17, 2020

Related U.S. Application Data

(60) Provisional application No. 62/818,334, filed on Mar. 14, 2019, provisional application No. 62/819,168, filed on Mar. 15, 2019.

(51) Int. Cl.
| | |
|---|---|
| *H03F 1/07* | (2006.01) |
| *H03F 3/217* | (2006.01) |
| *H03F 3/189* | (2006.01) |
| *H03F 3/00* | (2006.01) |

(52) U.S. Cl.
CPC ............. *H03F 3/217* (2013.01); *H03F 3/005* (2013.01); *H03F 3/189* (2013.01)

(58) Field of Classification Search
CPC .................................. H03F 1/07; H03F 1/0288
USPC ............................................... 330/124 R, 295
See application file for complete search history.

(56) References Cited

U.S. PATENT DOCUMENTS

| | | | | |
|---|---|---|---|---|
| 8,049,558 B2* | 11/2011 | Wyse | ...................... | H03F 3/211 |
| | | | | 330/124 R |
| 8,717,343 B2* | 5/2014 | Lee | ......................... | G09G 3/20 |
| | | | | 345/209 |

\* cited by examiner

*Primary Examiner* — Henry Choe
(74) *Attorney, Agent, or Firm* — Withrow & Terranova, PLLC

(57) ABSTRACT

The present disclosure relates to a switchable power amplification structure including a first power amplifier (PA), a second PA, a front switching structure, and an end switching structure. The front switching structure is coupled to a radio frequency (RF) input port, and the end switching structure is coupled to an antenna port. Herein, the first PA and the second PA are parallel to each other, each of which is coupled between the front switching structure and the first end switching structure. The front switching structure is configured to selectively couple the first PA and the second PA to the RF input port, while the end switching structure is configured to selectively couple the first PA and the second PA to the first antenna port.

21 Claims, 6 Drawing Sheets

SWITCHABLE POWER AMPLIFICATION STRUCTURE

RELATED APPLICATIONS

This application claims the benefit of provisional patent application Ser. No. 62/818,334, filed Mar. 14, 2019, and provisional patent application Ser. No. 62/819,168, filed Mar. 15, 2019, the disclosures of which are hereby incorporated herein by reference in their entirety.

FIELD OF THE DISCLOSURE

The present disclosure relates to a power amplification structure, and particularly to a switchable power amplification structure with various operation modes.

BACKGROUND

Wireless communication devices, such as mobile telephones, are widely used and increasingly relied upon for personal and business communications. The increase demand in the amount of data transmitted over wireless systems requires a superior high speed signal transition. However, the high frequency signals cannot travel as far, so the wireless communication devices are required to achieve higher power output to compensate for high propagation losses of signals at the high frequencies.

Each communication device may include one or more radio frequency (RF) front end modules, which amplify RF signals before transmission or after reception. Typically, the RF front end module includes a power amplifier (PA) for amplifying RF signals before transmission. For superior high speed applications, the PA design is complicated, and it is a challenge to meet the output power requirements. Further, in different applications, the RF signals may be transmitted at different frequencies, and therefore, request different output power. Accordingly, there is a need to provide a flexible amplification structure, which is capable of handling various frequencies and output powers without increasing complexity of PA designs.

SUMMARY

The present disclosure relates to a switchable power amplification structure with various operation modes. The disclosed switchable power amplification structure includes a first power amplifier (PA), a second PA, a front switching structure, and a first end switching structure. The front switching structure is coupled to a radio frequency (RF) input port, and the first end switching structure is coupled to a first antenna port. Herein, the first PA and the second PA are parallel to each other, each of which is coupled between the front switching structure and the first end switching structure. The front switching structure is configured to selectively couple the first PA and the second PA to the RF input port, and the first end switching structure is configured to selectively couple the first PA and the second PA to the first antenna port.

In one embodiment of the switchable power amplification structure, the first PA and the second PA are identical.

In one embodiment of the switchable power amplification structure, the front switching structure includes a first front switch, a second front switch, a third front switch, a fourth front switch, a first front capacitor, a second front capacitor, a third front capacitor, and a front inductor. Herein, the first front capacitor and the first front switch are coupled in series between the RF input port and an input terminal of the first PA. The second front capacitor and the second front switch are coupled in series between the RF input port and an input terminal of the second PA. The third front capacitor and the third front switch are coupled in series between the RF input port and ground. The fourth front switch is coupled between the RF input port and the input terminal of the first PA. The front inductor is coupled between the RF input port and ground.

In one embodiment of the switchable power amplification structure, the first end switching structure includes a first end switch, a second end switch, a third end switch, a fourth end switch, a first end capacitor, a second end capacitor, a third end capacitor, and a first end inductor. Herein, the first end switch and the first end capacitor are coupled in series between an output terminal of the first PA and the first antenna port. The second end switch and the second end capacitor are coupled in series between the output terminal of the second PA and the first antenna port. The third end switch and the third end capacitor are coupled in series between the first antenna port and ground. The fourth end switch is coupled between the output terminal of the first PA and the first antenna port. The first end inductor is coupled between the first antenna port and ground.

In one embodiment of the switchable power amplification structure, the first front capacitor has a same capacitance as the second front capacitor, and has a different capacitance from the third front capacitor. The first end capacitor has a same capacitance as the second end capacitor, and has a different capacitance from the third end capacitor.

In one embodiment of the switchable power amplification structure, the first end switching structure further includes a fifth end switch coupled between the first antenna port and a first RF receiving port that is separate from the first PA and the second PA.

In one embodiment of the switchable power amplification structure, when the first front switch, the second front switch, the first end switch, and the second end switch are closed, and the third front switch, the fourth front switch, the third end switch, the fourth end switch, and the fifth end switch are open, the first PA and the second PA are both activated. When the third front switch, the fourth front switch, the third end switch, and the fourth end switch are closed, and the first front switch, the second front switch, the first end switch, the second end switch, and the fifth end switch are open, the first PA is activated and the second PA is deactivated. When the first front switch, the second front switch, the third front switch, the fourth front switch, the first end switch, the second end switch, and the fourth end switch are open, and the third end switch and the fifth end switch are closed, the first PA and the second PA are deactivated. Herein, the first end switching structure is configured to conduct RF signals from the first antenna port to the first RF receiving port.

In one embodiment of the switchable power amplification structure, when the first PA and the second PA are both activated, or the first PA is activated and the second PA is deactivated, input impedance seen into the RF input port maintains the same. When the first PA and the second PA are both activated, or the first PA is activated and the second PA is deactivated, or the first end switching structure conducts the RF signals from the first antenna port to the first RF receiving port, output impedance seen back into the first antenna port maintains the same.

In one embodiment of the switchable power amplification structure, the input impedance is 50 Ohm.

In one embodiment of the switchable power amplification structure, the output impedance is 50 Ohm.

According to another embodiment, the switchable power amplification structure further includes a second end switching structure coupled to a second antenna port. Herein, the second antenna port is separate from the first antenna port. Each of the first PA and the second PA is also coupled between the front switching structure and the second end switching structure. The second end switching structure is configured to selectively couple the first PA and the second PA to the second antenna port.

In one embodiment of the switchable power amplification structure, the first end switching structure and the second end switching structure are identical.

In one embodiment of the switchable power amplification structure, the second end switching structure includes a sixth end switch, a seventh end switch, an eighth end switch, a ninth end switch, a tenth end switch, a fourth end capacitor, a fifth end capacitor, a sixth end capacitor, and a second end inductor. Herein, the sixth end switch and the fourth end capacitor are coupled in series between the output terminal of the first PA and the second antenna port. The seventh end switch and the fifth end capacitor are coupled in series between the output terminal of the second PA and the second antenna port. The eighth end switch and the sixth end capacitor are coupled in series between the second antenna port and ground. The ninth end switch is coupled between the output terminal of the first PA and the second antenna port. The tenth end switch is coupled between the second antenna port and a second RF receiving port. The second end inductor is coupled between the second antenna port and ground.

In one embodiment of the switchable power amplification structure, the fourth end capacitor has a same capacitance as the fifth end capacitor, and has a different capacitance from the sixth end capacitor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
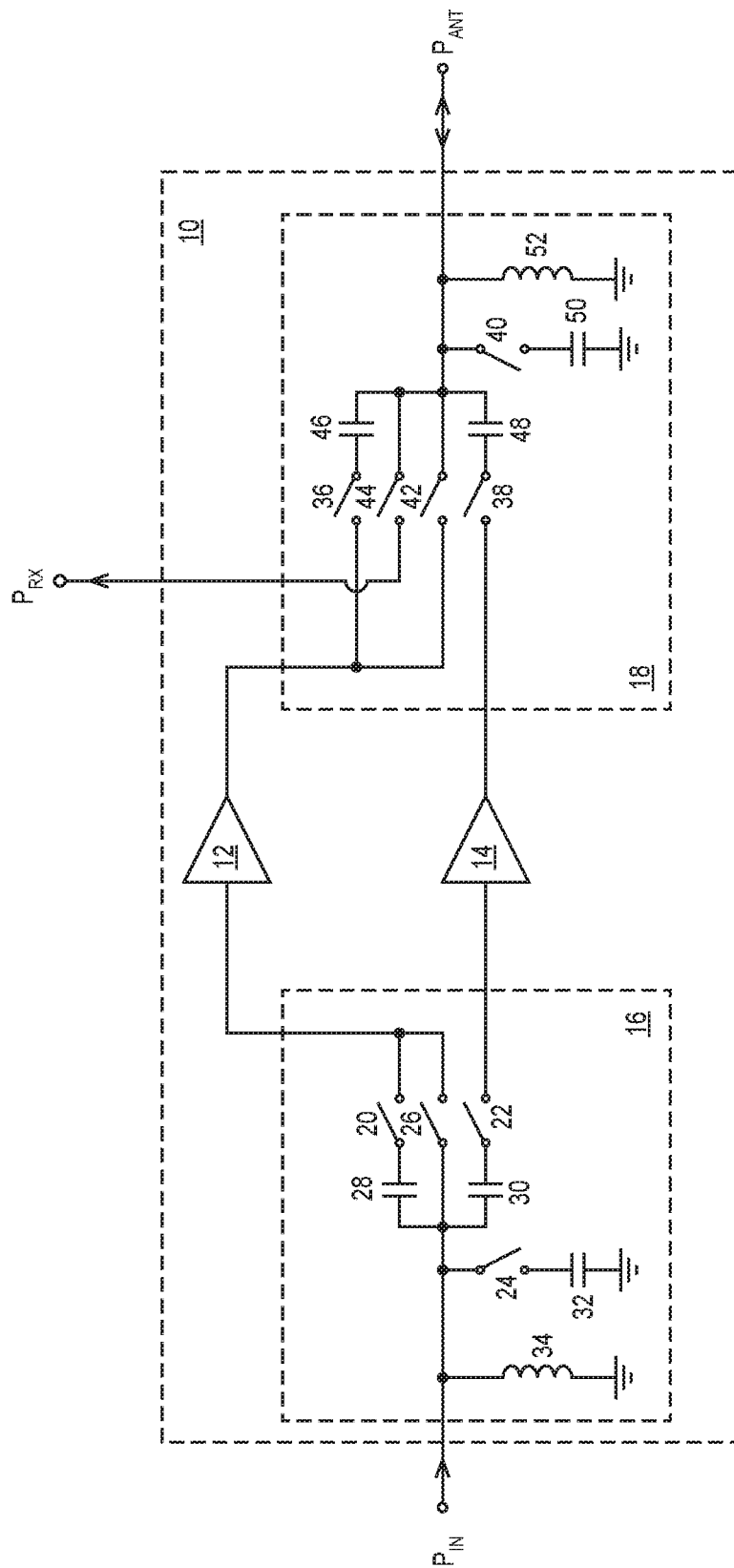
FIGS. 1A-1D show an exemplary switchable power amplification structure according to one embodiment of the present disclosure.

It will be understood that for clear illustrations, FIGS. 1A-3 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A illustrates an exemplary switchable power amplification structure 10, which may be provided in a radio frequency (RF) front end module (not shown), according to one embodiment of the present disclosure. The switchable power amplification structure 10 includes a first power amplifier (PA) 12, a second PA 14, a front switching structure 16, and an end switching structure 18. The front switching structure 16 is coupled to an RF input port $P_{IN}$, from which the switchable power amplification structure 10 receives outbound RF signals. The end switching structure 18 is coupled to an antenna port $P_{ANT}$, from which the switchable power amplification structure 10 transmits the outbound RF signals or receives RF inbound signals. The first PA 12 and the second PA 14 are parallel to each other, and each of them is coupled between the front switching structure 16 and the end switching structure 18. The front switching structure 16 is configured to selectively couple the first PA 12 and the second PA 14 to the RF input port $P_{IN}$. The end switching structure 18 is configured to selectively couple the first PA 12 and the second PA 14 to the antenna port $P_{ANT}$. Herein, selectively coupling the first PA 12 and the second PA 14 to one port refers to coupling both PAs 12 and 14 to the port, or only coupling the first PA 12 (or only coupling the second PA 14) to the port, or coupling neither of PAs 12 and 14 to the port.

In details, the front switching structure 16 includes a first front switch 20, a second front switch 22, a third front switch 24, a fourth front switch 26, a first front capacitor 28, a second front capacitor 30, a third front capacitor 32, and a front inductor 34. Herein, the first front capacitor 28 and the first front switch 20 are coupled in series between the RF input port $P_{IN}$ and an input terminal of the first PA 12. The second front capacitor 30 and the second front switch 22 are coupled in series between the RF input port $P_{IN}$ and an input terminal of the second PA 14. The third front switch 24 and the third front capacitor 32 are coupled in series between the RF input port $P_{IN}$ and ground. The fourth front switch 26 is coupled between the RF input port $P_{IN}$ and the input terminal of the first PA 12. The front inductor 34 is coupled between the RF input port $P_{IN}$ and ground.

Similarly, the end switching structure 18 includes a first end switch 36, a second end switch 38, a third end switch 40, a fourth end switch 42, a fifth end switch 44, a first end capacitor 46, a second end capacitor 48, a third end capacitor 50, and an end inductor 52. Herein, the first end switch 36 and the first end capacitor 46 are coupled in series between an output terminal of the first PA 12 and the antenna port $P_{ANT}$. The second end switch 38 and the second end capacitor 48 are coupled in series between an output terminal of the second PA 14 and the antenna port $P_{ANT}$. The third end switch 40 and the third end capacitor 50 are coupled in series between the antenna port $P_{ANT}$ and ground. The fourth end switch 42 is coupled between the output terminal of the first PA 12 and the antenna port $P_{ANT}$. The fifth end switch 44 is coupled between the antenna port $P_{ANT}$ and a RF receiving port $P_{RX}$, which is configured to receive the RF inbound signals from the antenna port $P_{ANT}$. The end inductor 52 is coupled between the antenna port $P_{ANT}$ and ground.

By selectively opening or closing the switches in the front switching structure 16 and the switches in the end switching structure 18, the switchable power amplification structure 10 is configured to operate in different modes. When the first front switch 20, the second front switch 22, the third front switch 24, the fourth front switch 26, the first end switch 36, the second end switch 38, the third end switch 40, the fourth end switch 42, and the fifth end switch 44 are open, the switchable power amplification structure 10 is completely off, as shown in FIG. 1A.

Figure 1B:
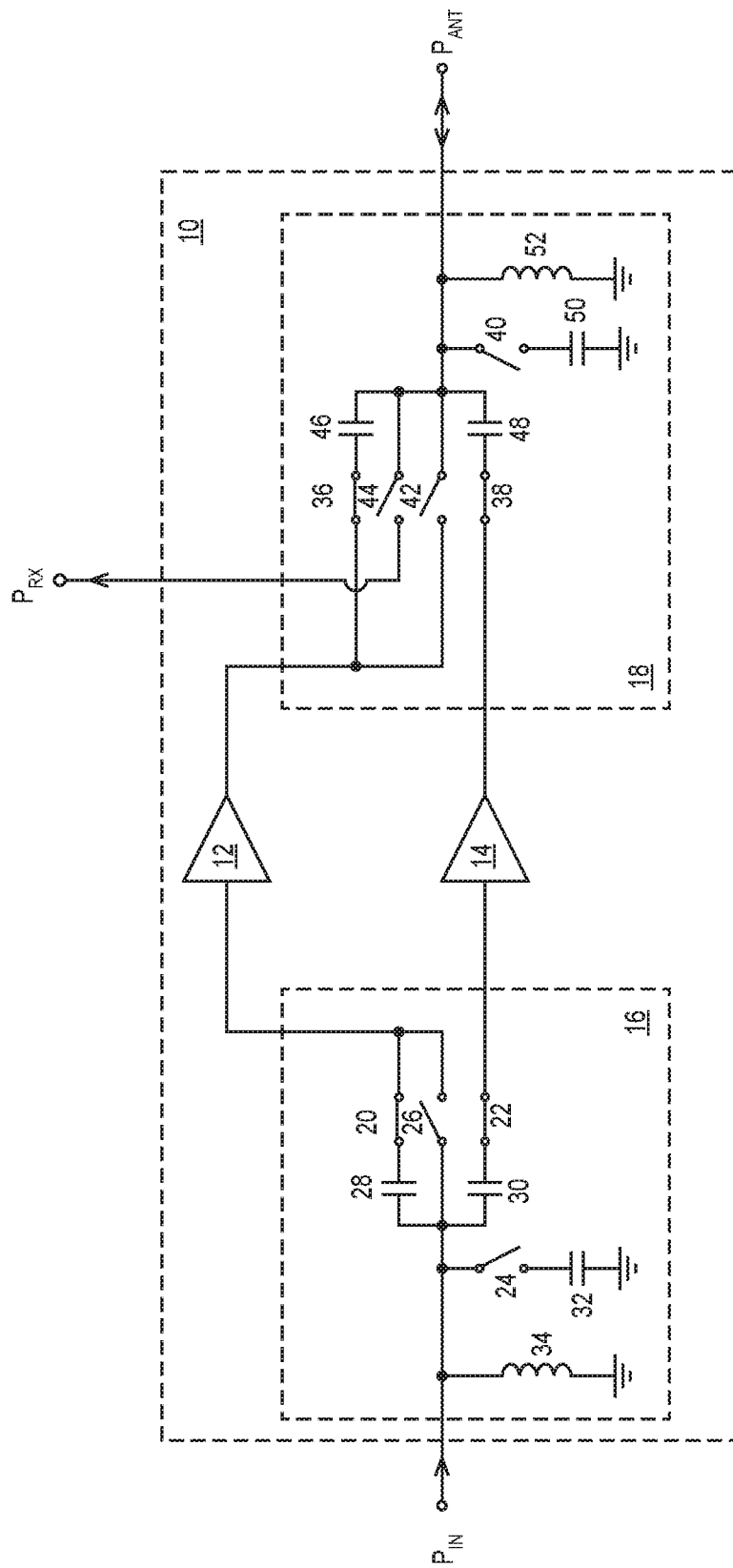

When the first front switch 20, the second front switch 22, the first end switch 36, and the second end switch 38 are closed, and the third front switch 24, the fourth front switch 26, the third end switch 40, the fourth end switch 42, and the fifth end switch 44 are open, the switchable power amplification structure 10 operates in a two-PA mode, where the first PA 12 and the second PA 14 are both activated, as shown in FIG. 1B. The first PA 12 and the second PA 14 may be identical, the first front capacitor 28 may have a same capacitance as the second front capacitor 30, and the first end capacitor 46 may have a same capacitance as the second end capacitor 48. In this embodiment, the front switching structure 16 (a combination of the first front switch 20, the second front switch 22, the first front capacitor 28, the second front capacitor 30, and the front inductor 34) is configured to evenly split the outbound RF signal (received from the RF input port $P_{IN}$) between the first PA 12 and the second PA 14, while maintaining an input impedance level (seen into the RF input port $P_{IN}$) as if the front switching structure 16 were omitted and the outbound RF signal were directly fed into the first PA 12 or the second PA 14. The input impedance (seen into the RF input port $P_{IN}$) that can be realized includes 50 Ohm. The first PA 12 and the second PA 14 amplify the split outbound RF signals, respectively.

Further, the end switching structure 18 (a combination of the first end switch 36, the second end switch 38, the first end capacitor 46, the second end capacitor 48, and the end inductor 52) is configured to merge the amplified split outbound RF signals into one merged outbound RF signal at the antenna port $P_{ANT}$. When the end switching structure 18 is fed with identical split outbound RF signals from the first PA 12 and the second PA 14, the end switching structure 18 may maintain an output impedance level (seen back into the antenna port $P_{ANT}$) as if the end switching structure 18 were omitted and the amplified split outbound RF signal from the first PA 12 or the second PA 14 were directly transmitted to the antenna port $P_{ANT}$. The output impedance (seen back into the antenna port $P_{ANT}$) that can be realized includes 50 Ohm.

Figure 1C:
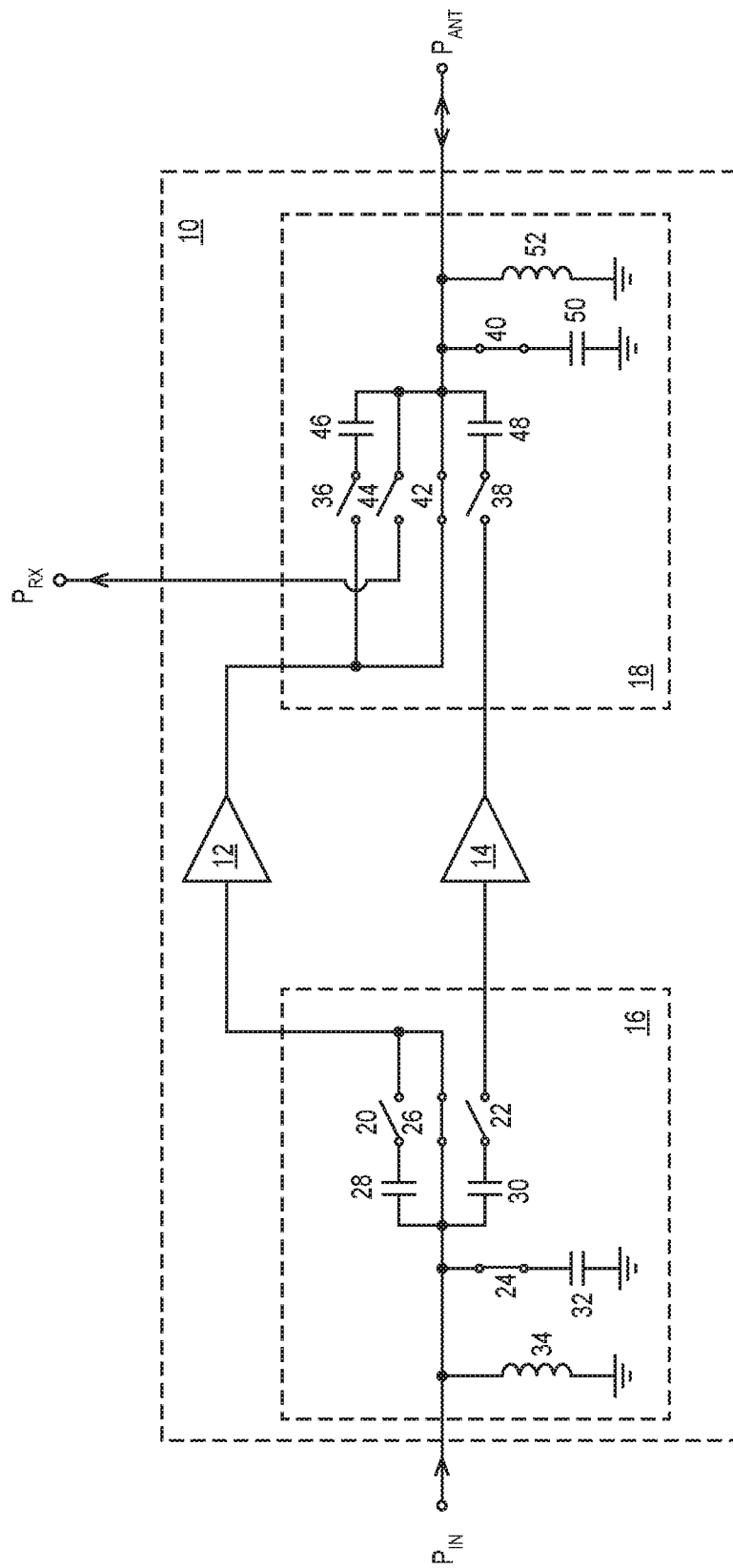

When the first front switch 20, the second front switch 22, the first end switch 36, the second end switch 38, and the fifth end switch 44 are open, and the third front switch 24, the fourth front switch 26, the third end switch 40, and the fourth end switch 42 are closed, the switchable power amplification structure 10 operates in a one-PA mode, where the first PA 12 is activated and the second PA 14 is deactivated, as shown in FIG. 1C. Herein, the outbound RF signal is only fed to the first PA 12 via the fourth front switch 26. The third front capacitor 32 is a shunt matching capacitor and activated by closing the third front switch 24. The third front capacitor 32 is chosen to resonate with the front inductor 34 so as to maintain the input impedance level (seen into the RF input port $P_{IN}$) as if the front switching structure 16 were omitted and the RF outbound signal were directly fed into the first PA 12. The input impedance (seen into the RF input port $P_{IN}$) that can be realized includes 50 Ohm. Further, the amplified outbound RF signal, which is only provided by the first PA 12, is fed to the antenna port $P_{ANT}$ via the fourth end switch 42. The third end capacitor 50 is a shunt matching capacitor and activated by closing the third end switch 40. The third end capacitor 50 is chosen to resonate with the end inductor 52 so as to maintain the output impedance level (seen back into the antenna port $P_{ANT}$) as if the end switching structure 18 were omitted and the amplified outbound RF signal were directly transmitted from the first PA 12 to the antenna port $P_{ANT}$. The output impedance (seen back into the antenna port $P_{ANT}$) that can be realized includes 50 Ohm.

Note that regardless of the two-PA mode or one-PA mode of the switchable power amplification structure 10, the input impedance seen into the RF input port $P_{IN}$ maintains the same. The combination of the first front capacitor 28, the second front capacitor 30, and the front inductor 34 (in the two-PA mode) and the combination of the third front capacitor 32 and the front inductor 34 (in the one-PA mode) realize the same input impedance (seen into the RF input port $P_{IN}$). The third front capacitor 32 has a different capacitance from the first front capacitor 28. Similarly, regardless of the two-PA mode or the one-PA mode of the switchable power amplification structure 10, the output impedance seen back into the antenna port $P_{ANT}$ maintains the same. The combination of the first end capacitor 46, the second end capacitor 48, and the end inductor 52 (in the two-PA mode) and the combination of the third end capacitor 50 and the end inductor 52 (in the one-PA mode) realize the same output impedance (seen back into the antenna port $P_{ANT}$). Herein, the third end capacitor 50 has a different capacitance from the first end capacitor 46. Further, in the one-PA mode, the output power (of the amplified outbound RF signal) provided by the switchable power amplification structure 10 may be the same as an output power provided by the first PA 12 alone. In the two-PA mode, the output power (of the merged amplified RF outbound signal) provided by the switchable power amplification structure 10 may be double that of the output power provided by the first PA 12 alone.

Figure 1D:
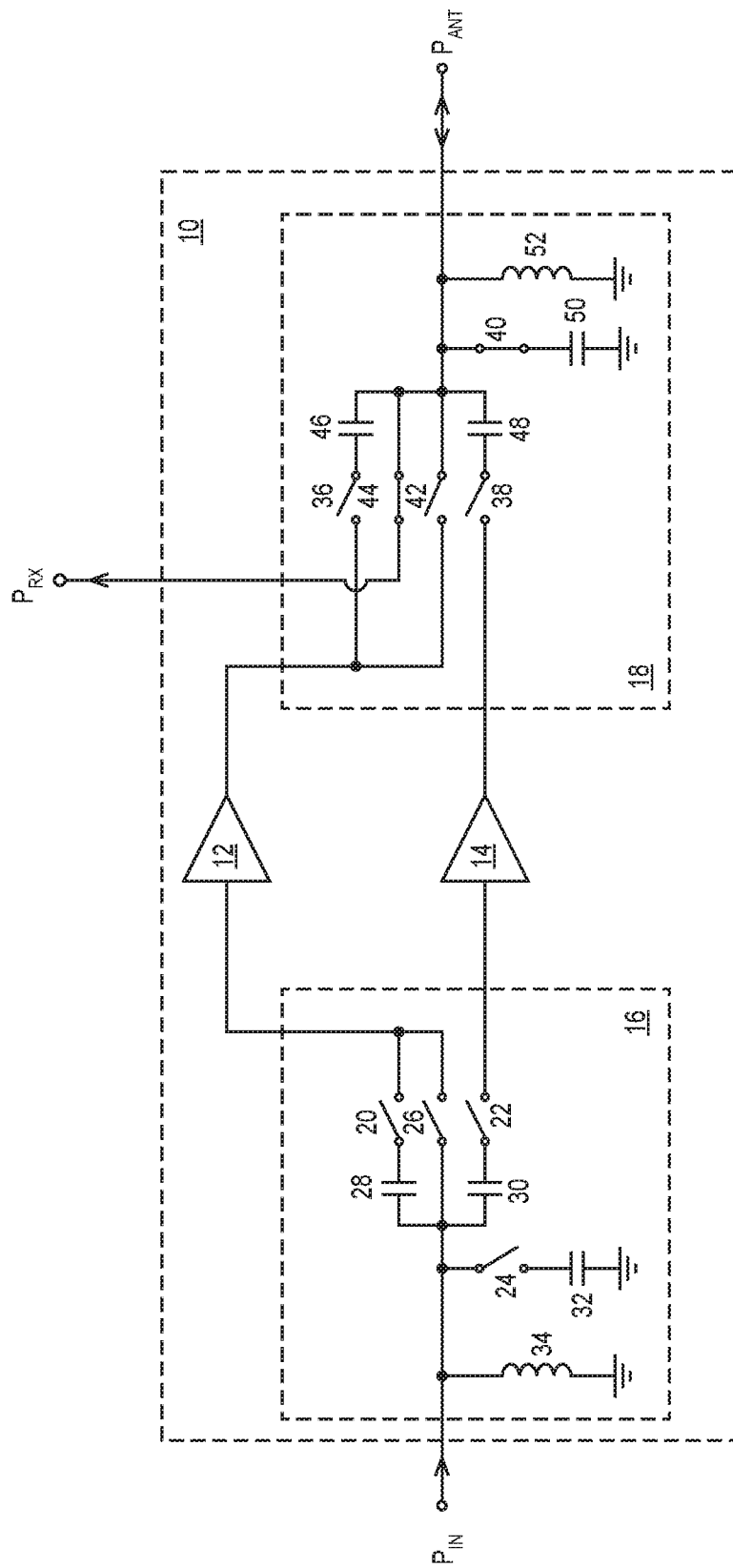

In addition, when the first front switch 20, the second front switch 22, the third front switch 24, the fourth front switch 26, the first end switch 36, the second end switch 38, and the fourth end switch 42 are open, and the third end switch 40 and the fifth end switch 44 are closed, the switchable power amplification structure 10 operates in a receiving mode, where the first PA 12 and the second PA 14 are deactivated, and the end switching structure 18 is configured to conduct the inbound RF signals from the antenna port $P_{ANT}$ to the RF receiving port $P_{RX}$, as shown in FIG. 1D. Herein, the RF receiving port $P_{RX}$ is separate from the first PA 12 and the second PA 14, and may be coupled to a low-noise amplifier in the RF front-end module (not shown), which is configured to amplify the inbound RF signals after reception. The RF receiving port $P_{RX}$ is connected to the antenna port $P_{ANT}$ by closing the fifth end switch 44. Closing the third end switch 40 enables the third end capacitor 32 to resonate with the end inductor 52 so as to maintain the output impedance level (seen back into the antenna port $P_{ANT}$). Herein, the output impedance (seen back into the antenna port $P_{ANT}$) that can be realized includes 50 Ohm.

Regardless of the two-PA mode, one-PA mode, or the receiving mode of the switchable power amplification structure 10, the output impedance seen back into the antenna port $P_{ANT}$ maintains the same. In some applications, the fifth end switch 44 may not be included in the end switching structure 18, and the switchable power amplification structure 10 will not operate in the receiving mode.

Figure 2:
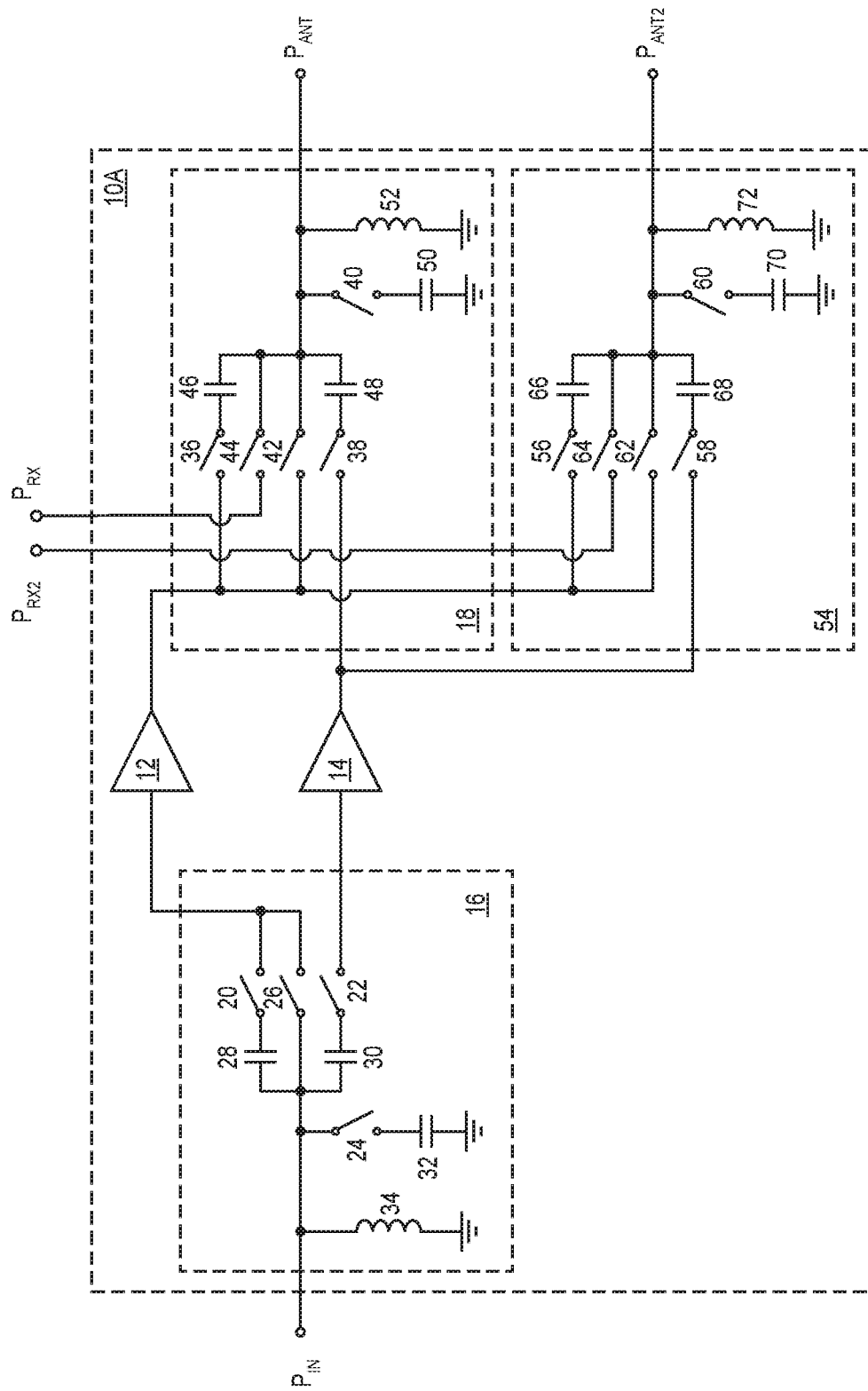
FIG. 2 shows an alternative switchable power amplification structure according to one embodiment of the present disclosure.

FIG. 2 shows an alternative switchable power amplification structure 10A according to one embodiment of the present disclosure. Compared to the switchable power amplification structure 10, the alternative switchable power amplification structure 10A includes more than one end switching structure. For the purpose of this illustration, besides the first PA 12, the second PA 14, the front switching structure 16, the end switching structure 18, the alternative switchable power amplification structure 10A further includes a second end switching structure 54 coupled to a second antenna port $P_{ANT2}$. Herein, the second antenna port $P_{ANT2}$ is separate from the antenna port $P_{ANT}$. Both the first PA 12 and the second PA 14 are also coupled between the front switching structure 16 and the second end switching structure 54. The second end switching structure 54 is configured to selectively couple the first PA 12 and the second PA 14 to the second antenna port $P_{ANT2}$. In some applications, the alternative switchable power amplification structure 10A may include more end switching structures.

In detail, the second end switching structure 54 includes a sixth end switch 56, a seventh end switch 58, an eighth end switch 60, a ninth end switch 62, a tenth end switch 64, a fourth end capacitor 66, a fifth end capacitor 68, a sixth end capacitor 70, and a second end inductor 72. Herein, the sixth end switch 56 and the fourth end capacitor 66 are coupled in series between the output terminal of the first PA 12 and the second antenna port $P_{ANT2}$. The seventh end switch 58 and the fifth end capacitor 68 are coupled in series between the output terminal of the second PA 14 and the second antenna port $P_{ANT2}$. The eighth end switch 60 and the sixth end capacitor 70 are coupled in series between the second antenna port $P_{ANT2}$ and ground. The fourth end capacitor 66 has a same capacitance as the fifth end capacitor 68, and has a different capacitance from the sixth end capacitor 70. In addition, the ninth end switch 62 is coupled between the output terminal of the first PA 12 and the second antenna port $P_{ANT2}$. The tenth end switch 64 is coupled between the second antenna port $P_{ANT2}$ and a second RF receiving port $P_{RX2}$, which is configured to receive some other RF inbound signals from the second antenna port $P_{ANT2}$. The second end inductor 72 is coupled between the second antenna port $P_{ANT2}$ and ground.

The end switching structure 18 and the second end switching structure 54 are separate from each other. As such, the end switching structure 18 and the second end switching structure 54 may operate simultaneously or singly. In the two-PA mode, the alternative switchable power amplification structure 10A may provide the merged outbound RF signal (from both the first PA 12 and the second PA 14) to at least one of the antenna port $P_{ANT}$ and the second antenna port $P_{ANT2}$. In the one-PA mode, the alternative switchable power amplification structure 10A may provide the amplified outbound RF signal (from only the first PA 12) to at least one of the antenna port $P_{ANT}$ and the second antenna port $P_{ANT2}$. In the receiving mode, the alternative switchable power amplification structure 10A may conduct the RF inbound signals from the antenna port $P_{ANT}$ to the RF receiving port $P_{RX}$ and/or conduct the RF inbound signals from the second antenna port $P_{ANT2}$ to the second RF receiving port $P_{RX2}$. In some applications, the fifth end switch 44 may not be included in the end switching structure 18 and the tenth end switch 64 may not be included in the second end switching structure 54. Accordingly, the alternative switchable power amplification structure 10A will not operate in the receiving mode.

In one embodiment, the end switching structure 18 and the second end switching structure 54 may be identical. Regardless of the two-PA mode or one-PA mode of the alternative switchable power amplification structure 10A, the input impedance seen into the RF input port $P_{IN}$ maintains the same. Similarly, regardless of the two-PA mode, one-PA mode, or the receiving mode of the alternative switchable power amplification structure 10A, the output impedance seen back into the antenna port $P_{ANT}$ maintains constant (if the end switching structure 18 is activated), and the output impedance seen back into the second antenna port $P_{ANT2}$ maintains constant (if the second end switching structure 54 is activated). Further, the output impedance seen back into the antenna port $P_{ANT}$ and the output impedance seen back into the second antenna port $P_{ANT2}$ may be the same.

If the antenna port $P_{ANT}$ and the second antenna port $P_{ANT2}$ are configured to operate at different frequencies, the end switching structure 18 and the second end switching structure 54 may have different element values. The first end capacitor 46 in the end switching structure 18 and the corresponding fourth end capacitor 66 in the second end switching structure 54 may have different values; the second end capacitor 48 in the end switching structure 18 and the corresponding fifth end capacitor 68 in the second end switching structure 54 may have different values; the third end capacitor 50 in the end switching structure 18 and the corresponding sixth end capacitor 70 in the second end switching structure 54 may have different values; and/or the end inductor 52 in the end switching structure 18 and the corresponding second end inductor 72 in the second end switching structure 54 may have different values.

Figure 3:
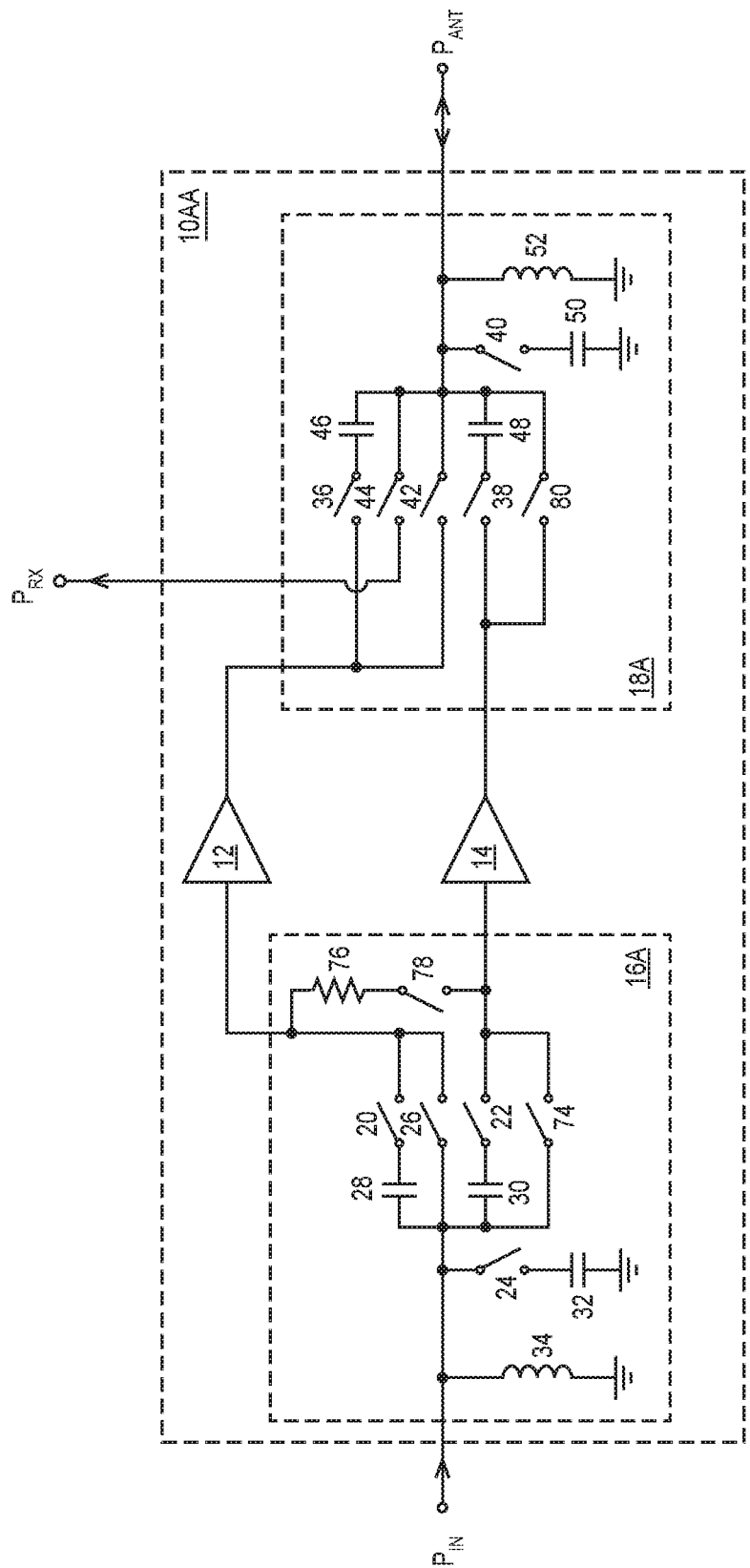
FIG. 3 shows another alternative switchable power amplification structure according to one embodiment of the present disclosure.

In the one-PA mode, as shown in FIG. 1C, only the first PA 12 is selected to operate. In one embodiment, the second PA 14 may also be selected to operate in the one-PA mode. FIG. 3 shows another alternative switchable power amplification structure 10AA including an alternative front switching structure 16A and an alternative end switching structure 18A. In the one-PA mode, the alternative switchable power amplification structure 10AA is configured to select either the first PA 12 or the second PA 14 to operate.

Compared to the front switching structure 16, the alternative front switching structure 16A further includes a fifth front switch 74 coupled between the RF input port $P_{IN}$ and the input terminal of the second PA 14. In some applications, the alternative front switching structure 16A may also include a front resistor 76 and a sixth front switch 78. Herein, the front resistor 76 and the sixth front switch 78 are coupled in series between the input terminal of the first PA 12 and the input terminal of the second PA 14. Compared to the end switching structure 18, the alternative end switching structure 18A further includes an eleventh end switch 80 coupled between the output terminal of the second PA 14 and the antenna port $P_{ANT}$.

Similar to the switchable power amplification structure 10, when the first front switch 20, the second front switch 22, the sixth front switch 78, the first end switch 36, and the second end switch 38 are closed, and the third front switch 24, the fourth front switch 26, the fifth front switch 74, the third end switch 40, the fourth end switch 42, the fifth end switch 44, and the eleventh end switch 80 are open, the alternative switchable power amplification structure 10AA operates in the two-PA mode. The front resistor 76 is configured to provide isolation between the input terminal of the first PA 12 and the input terminal of the second PA 14, when the outbound RF signal is split to feed both the first PA 12 and the second PA 14.

When the first front switch 20, the second front switch 22, the fifth front switch 74, the sixth front switch 78, the first end switch 36, the second end switch 38, the fifth end switch 44, and the eleventh end switch 80 are open, and the third front switch 24, the fourth front switch 26, the third end switch 40, and the fourth end switch 42 are closed, the alternative switchable power amplification structure 10AA operates in a first one-PA mode (with the first PA 12 operation).

When the first front switch 20, the second front switch 22, the fourth front switch 26, the sixth front switch 78, the first end switch 36, the second end switch 38, the fourth end switch 42, and the fifth end switch 44 are open, and the third front switch 24, the fifth front switch 74, the third end switch 40, and the eleven end switch 80 are closed, the alternative switchable power amplification structure 10AA operates in a second one-PA mode (with the second PA 14 operation).

In addition, when the first front switch 20, the second front switch 22, the third front switch 24, the fourth front switch 26, the fifth front switch 74, the sixth front switch 78, the first end switch 36, the second end switch 38, the fourth end switch 42, and the eleventh end switch 80 are open, and the third end switch 40 and the fifth end switch 44 are closed, the alternative switchable power amplification structure 10AA operates in the receiving mode, where the first PA 12 and the second PA 14 are deactivated, and the alternative end switching structure 18A is configured to conduct the inbound RF signals from the antenna port $P_{ANT}$ to the RF receiving port $P_{RX}$.

Note that regardless of the two-PA mode, the first one-PA mode, or the second one-PA mode of the alternative switchable power amplification structure 10AA, the input impedance seen into the RF input port $P_{IN}$ maintains the same. Regardless of the two-PA mode, the first one-PA mode, the second one-PA mode, or the receiving mode of the alternative switchable power amplification structure 10AA, the output impedance seen back into the antenna port $P_{ANT}$ maintains the same.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a first power amplifier (PA) and a second PA;
   a front switching structure coupled to a radio frequency (RF) input port, wherein:
   the front switching structure comprises a first front switch, a second front switch, a third front switch, a fourth front switch, a first front capacitor, a second front capacitor, a third front capacitor, and a front inductor;
   the first front capacitor and the first front switch are coupled in series between the RF input port and an input terminal of the first PA, the second front capacitor and the second front switch are coupled in series between the RF input port and an input terminal of the second PA, the third front capacitor and the third front switch are coupled in series between the RF input port and ground, the fourth front switch is coupled between the RF input port and the input terminal of the first PA, and the front inductor is coupled between the RF input port and ground; and
   a first end switching structure coupled to a first antenna port, wherein:
   the first PA and the second PA are parallel to each other, each of which is coupled between the front switching structure and the first end switching structure;
   the front switching structure is configured to selectively couple the first PA and the second PA to the RF input port; and
   the first end switching structure is configured to selectively couple the first PA and the second PA to the first antenna port.

2. The apparatus of claim 1 wherein the first PA and the second PA are identical.

3. The apparatus of claim 1 wherein the first front capacitor has a same capacitance as the second front capacitor, and has a different capacitance from the third front capacitor.

4. The apparatus of claim 1 wherein the first end switching structure comprises a first end switch, a second end switch, a third end switch, a fourth end switch, a first end capacitor, a second end capacitor, a third end capacitor, and a first end inductor, wherein:
the first end switch and the first end capacitor are coupled in series between an output terminal of the first PA and the first antenna port;
the second end switch and the second end capacitor are coupled in series between an output terminal of the second PA and the first antenna port;
the third end switch and the third end capacitor are coupled in series between the first antenna port and ground;
the fourth end switch is coupled between the output terminal of the first PA and the first antenna port; and
the first end inductor is coupled between the first antenna port and ground.

5. The apparatus of claim 4 wherein:
the first front capacitor has a same capacitance as the second front capacitor, and has a different capacitance from the third front capacitor; and
the first end capacitor has a same capacitance as the second end capacitor, and has a different capacitance from the third end capacitor.

6. The apparatus of claim 4 wherein:
when the first front switch, the second front switch, the first end switch, and the second end switch are closed, and the third front switch, the fourth front switch, the third end switch, and the fourth end switch are open, the first PA and the second PA are both activated; and
when the third front switch, the fourth front switch, the third end switch, and the fourth end switch are closed, and the first front switch, the second front switch, the first end switch, and the second end switch are open, the first PA is activated and the second PA is deactivated.

7. The apparatus of claim 6 wherein:
when the first PA and the second PA are both activated, or the first PA is activated and the second PA is deactivated, input impedance seen into the RF input port maintains the same; and
when the first PA and the second PA are both activated, or the first PA is activated and the second PA is deactivated, output impedance seen back into the first antenna port maintains the same.

8. The apparatus of claim 7 wherein the input impedance is 50 Ohm.

9. The apparatus of claim 7 wherein the output impedance is 50 Ohm.

10. The apparatus of claim 4 wherein the first end switching structure further comprises a fifth end switch coupled between the first antenna port and a first RF receiving port that is separate from the first PA and the second PA.

11. The apparatus of claim 10 wherein:
when the first front switch, the second front switch, the first end switch, and the second end switch are closed, and the third front switch, the fourth front switch, the third end switch, the fourth end switch, and the fifth end switch are open, the first PA and the second PA are both activated;
when the third front switch, the fourth front switch, the third end switch, and the fourth end switch are closed, and the first front switch, the second front switch, the first end switch, the second end switch, and the fifth end switch are open, the first PA is activated and the second PA is deactivated; and
when the first front switch, the second front switch, the third front switch, the fourth front switch, the first end switch, the second end switch, and the fourth end switch are open, and the third end switch and the fifth end switch are closed, the first PA and the second PA are deactivated, wherein the first end switching structure is configured to conduct RF signals from the first antenna port to the first RF receiving port.

12. The apparatus of claim 11 wherein:
when the first PA and the second PA are both activated, or the first PA is activated and the second PA is deactivated, input impedance seen into the RF input port maintains the same; and
when the first PA and the second PA are both activated, or the first PA is activated and the second PA is deactivated, or the first end switching structure conducts the RF signals from the first antenna port to the first RF receiving port, output impedance seen back into the first antenna port maintains the same.

13. The apparatus of claim 4 wherein:
the front switching structure further comprises a fifth front switch, which is coupled between the RF input port and the input terminal of the second PA; and
the first end switching structure further comprises a fifth end switch, which is coupled between the output terminal of the second PA and the first antenna port.

14. The apparatus of claim 13 wherein the front switching structure further comprises a sixth front switch and a front resistor, wherein the front resistor and the sixth front switch are coupled in series between the input terminal of the first PA and the input terminal of the second PA.

15. An apparatus comprising:
a first power amplifier (PA) and a second PA;
a front switching structure coupled to a radio frequency (RF) input port; and
a first end switching structure coupled to a first antenna port, wherein:
the first PA and the second PA are parallel to each other, each of which is coupled between the front switching structure and the first end switching structure;
the front switching structure is configured to selectively couple the first PA and the second PA to the RF input port;
the first end switching structure is configured to selectively couple the first PA and the second PA to the first antenna port, and comprises a first end switch, a second end switch, a third end switch, a fourth end switch, a first end capacitor, a second end capacitor, a third end capacitor, and a first end inductor, wherein:
the first end switch and the first end capacitor are coupled in series between an output terminal of the first PA and the first antenna port;
the second end switch and the second end capacitor are coupled in series between an output terminal of the second PA and the first antenna port;
the third end switch and the third end capacitor are coupled in series between the first antenna port and ground;
the fourth end switch is coupled between the output terminal of the first PA and the first antenna port; and the first end inductor is coupled between the first antenna port and ground.

16. The apparatus of claim 15 wherein the first end capacitor has a same capacitance as the second end capacitor, and has a different capacitance from the third end capacitor.

17. The apparatus of claim 1 further comprising a second end switching structure coupled to a second antenna port, wherein:
- the second antenna port is separate from the first antenna port;
- each of the first PA and the second PA is coupled between the front switching structure and the second end switching structure; and
- the second end switching structure is configured to selectively couple the first PA and the second PA to the second antenna port.

18. The apparatus of claim 17 wherein the first end switching structure and the second end switching structure are identical.

19. The apparatus of claim 17 wherein the first front capacitor has a same capacitance as the second front capacitor, and has a different capacitance from the third front capacitor.

20. The apparatus of claim 17 wherein:
- the first end switching structure comprises a first end switch, a second end switch, a third end switch, a fourth end switch, a fifth end switch, a first end capacitor, a second end capacitor, a third end capacitor, and a first end inductor, wherein:
  - the first end switch and the first end capacitor are coupled in series between an output terminal of the first PA and the first antenna port;
  - the second end switch and the second end capacitor are coupled in series between an output terminal of the second PA and the first antenna port;
  - the third end switch and the third end capacitor are coupled in series between the first antenna port and ground;
  - the fourth end switch is coupled between the output terminal of the first PA and the first antenna port;
  - the fifth end switch is coupled between the first antenna port and a first RF receiving port; and
  - the first end inductor is coupled between the first antenna port and ground; and
- the second end switching structure comprises a sixth end switch, a seventh end switch, an eighth end switch, a ninth end switch, a tenth end switch, a fourth end capacitor, a fifth end capacitor, a sixth end capacitor, and a second end inductor, wherein:
  - the sixth end switch and the fourth end capacitor are coupled in series between the output terminal of the first PA and the second antenna port;
  - the seventh end switch and the fifth end capacitor are coupled in series between the output terminal of the second PA and the second antenna port;
  - the eighth end switch and the sixth end capacitor are coupled in series between the second antenna port and ground;
  - the ninth end switch is coupled between the output terminal of the first PA and the second antenna port;
  - the tenth end switch is coupled between the second antenna port and a second RF receiving port; and
  - the second end inductor is coupled between the second antenna port and ground.

21. The apparatus of claim 20 wherein:
- the first front capacitor has a same capacitance as the second front capacitor, and has a different capacitance from the third front capacitor;
- the first end capacitor has a same capacitance as the second end capacitor, and has a different capacitance from the third end capacitor; and
- the fourth end capacitor has a same capacitance as the fifth end capacitor, and has a different capacitance from the sixth end capacitor.

* * * * *